United States Patent
Yano et al.

(10) Patent No.: US 9,202,603 B2
(45) Date of Patent: *Dec. 1, 2015

(54) SPUTTERING TARGET, TRANSPARENT CONDUCTIVE FILM AND TRANSPARENT ELECTRODE

(71) Applicants: Idemitsu Kosan Co., Ltd., Tokyo (JP); Tokie Tanaka, Sodegaura-shi (JP)

(72) Inventors: Koki Yano, Sodegaura (JP); Kazuyoshi Inoue, Sodegaura (JP); Nobuo Tanaka, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 225 days.

This patent is subject to a terminal disclaimer.

(21) Appl. No.: 13/712,024

(22) Filed: Dec. 12, 2012

(65) Prior Publication Data

US 2013/0101807 A1 Apr. 25, 2013

Related U.S. Application Data

(62) Division of application No. 12/067,465, filed as application No. PCT/JP2006/318270 on Sep. 14, 2006, now Pat. No. 8,383,019.

(30) Foreign Application Priority Data

Sep. 20, 2005 (JP) ................................ 2005-271658

(51) Int. Cl.
*H01B 1/08* (2006.01)
*C23C 14/08* (2006.01)
(Continued)

(52) U.S. Cl.
CPC ................ *H01B 1/08* (2013.01); *C04B 35/453* (2013.01); *C04B 35/457* (2013.01); *C04B 35/6262* (2013.01); *C23C 14/086* (2013.01); *C23C 14/3414* (2013.01); *C04B 2235/3284* (2013.01); *C04B 2235/3286* (2013.01); *C04B 2235/3293* (2013.01); *C04B 2235/5445* (2013.01); *C04B 2235/6562* (2013.01);
(Continued)

(58) Field of Classification Search
CPC ............ H01B 1/00; H01B 1/08; C23C 14/08; H01M 4/06
USPC ................................ 252/518.1, 519.51, 520.1
See application file for complete search history.

(56) References Cited

U.S. PATENT DOCUMENTS 5,972,527 A 10/1999 Kaijou et al.
6,534,183 B1 3/2003 Inoue
(Continued)

FOREIGN PATENT DOCUMENTS

CN 1281544 3/2001
EP 1 592 050 A1 11/2005
(Continued)

OTHER PUBLICATIONS

Abstract for JP2004-294630, Oct. 21, 2004, Idemitsu Kosan Co. Ltd.
(Continued)

*Primary Examiner* — Mark Kopec
(74) *Attorney, Agent, or Firm* — Millen, White, Zelano & Branigan, P.C.

(57) ABSTRACT

A sputtering target including indium, tin, zinc and oxygen, and including a hexagonal layered compound, a spinel structure compound and a bixbyite structure compound.

14 Claims, 2 Drawing Sheets

(51) Int. Cl.

| | | |
|---|---|---|
| C04B 35/00 | (2006.01) | |
| C04B 35/453 | (2006.01) | |
| C04B 35/457 | (2006.01) | |
| C04B 35/626 | (2006.01) | |
| C23C 14/34 | (2006.01) | |

(52) U.S. Cl.
 CPC .............. *C04B 2235/6565* (2013.01); *C04B 2235/6567* (2013.01); *C04B 2235/6585* (2013.01); *C04B 2235/664* (2013.01); *C04B 2235/763* (2013.01); *C04B 2235/77* (2013.01); *C04B 2235/80* (2013.01); *C04B 2235/963* (2013.01); *Y10T 428/24777* (2015.01)

(56) References Cited

U.S. PATENT DOCUMENTS

| | | | |
|---|---|---|---|
| 6,669,830 | B1 | 12/2003 | Inoue et al. |
| 6,689,477 | B2 * | 2/2004 | Inoue ............................ 428/432 |
| 6,998,070 | B2 * | 2/2006 | Inoue et al. ............... 252/519.51 |
| 7,306,861 | B2 | 12/2007 | Inoue et al. |
| 8,383,019 | B2 | 2/2013 | Yano et al. |
| 8,524,123 | B2 * | 9/2013 | Yano et al. ................. 252/520.1 |
| 2003/0148871 | A1 | 8/2003 | Inoue et al. |
| 2004/0081836 | A1 | 4/2004 | Inoue et al. |
| 2004/0164281 | A1 | 8/2004 | Abe et al. |
| 2006/0234088 | A1 | 10/2006 | Inoue et al. |
| 2007/0037402 | A1 | 2/2007 | Inoue |
| 2008/0309223 | A1 | 12/2008 | Inoue et al. |
| 2010/0170696 | A1 | 7/2010 | Yano et al. |
| 2011/0121244 | A1 | 5/2011 | Yano et al. |
| 2013/0118774 | A1 * | 5/2013 | Yano et al. ................... 174/126.1 |

FOREIGN PATENT DOCUMENTS

| | | | |
|---|---|---|---|
| JP | 06-234565 | A | 8/1994 |
| JP | 2004-294630 | A | 10/2004 |
| KR | 10-2005-0034729 | A | 4/2005 |
| TW | 514622 | | 12/2002 |
| TW | 200402475 | | 2/2004 |
| TW | 200523226 | | 7/2005 |
| WO | WO 00/12445 | A1 | 3/2000 |
| WO | WO 01/38599 | A1 | 5/2001 |
| WO | WO 2007/034733 | | 3/2007 |

OTHER PUBLICATIONS

Abstract for JP06-234565, Aug. 23, 1994, Idemitsu Kosan Co. Ltd.
International Search Report for PCT/JP2006/318270 (Oct. 12, 2006).
"Technology of Transparent Conductive Film" edited by The 166th Committee of Transparent Oxide and Photoelectron Material, Japan Society for Promotion of Science, Ohmsha, Ltd. (1999) pp. 169-171.
Idemitsu Kosan Co Ltd., "Sputtering target, sintered body, conductive film formed by using them, organic EL device, and substrate used for the organic EL device," Publication Date: Feb. 16, 2004; English Abstract of JP-200402475.
Mitsui Mining and Smelting Co Ltd., "Indium oxide—tin oxide powder and sputtering target using the same," Publication Date: Jul. 16, 2005; English Abstract of TW-200523226.
Office Action in related Taiwanese Patent Application No. 095134816 dated Jul. 27, 2012.
Sun, S. et al., "Target synthesis and optoelectronic properties of the evaporated Mo-doped $In_2O_3$ (IMO) films," Department of Materials Science and Engineering National Cheng Kung University, May 2005.
Translation of part of Taiwanese Office Action relating to TW-200402475 and TW-200523226, Jul. 27, 2012.

* cited by examiner

SPUTTERING TARGET, TRANSPARENT CONDUCTIVE FILM AND TRANSPARENT ELECTRODE

This application is a divisional application of U.S. Ser. No. 12/067,465 filed Mar. 20, 2008 and issued as U.S. Pat. No. 8,383,109.

TECHNICAL FIELD

The present invention relates to a sputtering target prepared by sintering (hereinafter often referred to as sputtering target or simply as target), a transparent conductive film formed by using a sputtering target, and a transparent electrode.

BACKGROUND

In recent years, development of displays has been remarkable. Liquid crystal displays (LCD), electroluminescence displays (EL), field emission displays (FED), or the like are used as display devices for business machines such as personal computers and word processors, and control systems in factories. These displays have a sandwich structure in which a display device is held between transparent conductive oxides.

A mainstream material for such a transparent conductive oxide is indium tin oxide (hereinafter occasionally abbreviated as "ITO") prepared by a sputtering method, an ion plating method, or a vapor deposition method as described in Non-Patent Document 1.

ITO is composed of a specific amount of indium oxide and tin oxide, possesses excellent transparency and conductivity, can be etched using a strong acid, and exhibits high adhesion to a substrate.

Although ITO has excellent properties as a material for transparent conductive oxide, ITO is not only a scarce resource, but also contains a large amount (about 90 atomic percent) of indium which is a biologically harmful element. Moreover, the indium itself produces nodules (projections) during sputtering. The nodules produced on the target surface have been one of the causes of abnormal electrical discharge. In particular, when an amorphous ITO film is produced for improving etching properties, the indium compound on the surface of the target is reduced due to introduction of a small amount of water and hydrogen gas in the sputtering chamber, giving rise to further production of nodules. If an abnormal electrical discharge occurs, scattered materials become attached to the transparent conductive oxide as impurities during or immediately after the film formation.

The indium content in ITO must be reduced due to these problems of instability of supply (scarcity), hazardous properties and occurrence of nodules. However, if the content of indium in ITO is reduced to 90 atomic percent or less, a high-resistance tin compound in the target has electrical carriers (charges), leading to occurrence of abnormal electrical discharge.

In general, different etching solutions are used for etching a metal or a metal alloy and for etching ITO. Specifically, a phosphoric acid-based etching solution is used for etching a metal or a metal alloy (e.g. Al or Al alloy) and an oxalic acid-based etching solution is used for etching ITO. Therefore, productivity cannot be improved since equipment for an etching solution, such as a tank, is required to be provided separately for each material to be etched, and a wire and an electrode cannot be etched simultaneously.

As a method for preventing generation of nodules and suppressing abnormal electrical discharge, a hexagonal layered compound of $In_2O_3(ZnO)_m$, wherein m is an integer of 2 to 20, with a crystal grain diameter of 5 μm or less has been investigated (Patent Documents 1 and 2). However, if the indium content is reduced to 70 atomic percent or less in this method, a hexagonal layered compound having a high resistance with an increased number of ZnO ($In_2O_3(ZnO)_m$, wherein m is 4 or more) may be generated. Further, there are problems such as decrease of the sintered density and conductivity of the target, which causes abnormal electrical discharge and retards the film forming speed; low target strength, leading to easy cracking; and poor heat resistance in the presence of air of the transparent conductive film formed by sputtering.

Patent Document 1: WO01/038599
Patent Document 2: JP-A-06-234565
Non-Patent Document 1: "Technology of Transparent Conductive Film" edited by The 166th Committee of Transparent Oxide and Photoelectron Material, Japan Society for Promotion of Science, Ohmsha, Ltd. (1999)

The invention provides a target having a low resistance, high theoretical relative density and high strength, with a reduced indium content, which enables stable sputtering while suppressing abnormal electrical discharge generated when forming a transparent conductive film by sputtering, and is capable of forming a transparent conductive film which can be etched with a phosphoric acid-based etching solution which is an etching solution for a metal or an alloy, as well as a transparent conductive film prepared using such a target, a transparent electrode and a method for producing a transparent electrode.

SUMMARY OF THE INVENTION

An oxide sintered target containing indium, tin, and zinc as major components may contain a hexagonal layered compound of $In_2O_3(ZnO)_m$, wherein m is an integer of 2 to 20, a rutile structure compound of $SnO_2$, a wurtzite form compound of ZnO, a spinel structure compound of $Zn_2SnO_4$, a bixbyite structure compound of $In_2O_3$, a spinel structure compound of $ZnIn_2O_4$, and other crystal structures such as $ZnSnO_3$, $Sn_3In_4O_{12}$, and the like, depending on the form of raw materials, thermal history during sintering, the method of heat treatment, the content of components, and the like. Various combinations of these crystal structures are possible.

The inventors of the invention have found that, among combinations of many compounds, a combination of a spinel structure compound, bixbyite structure compound and hexagonal layered compound give a target with a low resistance, a high theoretical relative density, and a high strength. Although the reason for this effect cannot completely be elucidated, it is assumed that In is easily dissolved as a solid solute in a spinel structure compound of $Zn_2SnO_4$ or the like, and that when positive divalent Zn and positive tetravalent Sn are combined, positive trivalent In is easily replaced. Also, it is assumed that, when the indium content is reduced, if a target is composed only of indium and zinc, $In_2O_3(ZnO)_m$, wherein m is large, tends to be generated, whereas if a target contains an appropriate amount of Sn, relatively low-resistance $In_2O_3(ZnO)_m$, wherein m is 3, tends to be generated.

The inventors of the invention have also found that the transparent conductive film formed by sputtering this target excels in conductivity, etching properties, heat resistance, and the like, and is suitable for various applications such as a display of a liquid crystal display, a touch panel, a solar cell, and the like even if the content of indium is reduced.

The inventors of the invention have further found that a transparent conductive film formed by sputtering using this target can be etched with a phosphoric acid-based etching solution for a metal or an alloy, and hence, contributes to improvement in productivity. The invention has been made based on these findings.

The invention provides the following sputtering target, the method for producing the same, the transparent conductive film and the transparent electrode.

1. A sputtering target comprising indium, tin, zinc and oxygen, and comprising a hexagonal layered compound, a spinel structure compound and a bixbyite structure compound.
2. The sputtering target according to 1, wherein the hexagonal layered compound is shown by $In_2O_3(ZnO)_3$, the spinel structure compound is shown by $Zn_2SnO_4$, and the bixbyite structure compound is shown by $In_2O_3$.
3. The sputtering target according to 1 or 2, wherein the atomic ratio of In/(In+Sn+Zn) is in a range of 0.33 to 0.6 and the atomic ratio of Sn/(In+Sn+Zn) is in a range of 0.05 to 0.15.
4. The sputtering target according to any one of 1 to 3, wherein, in X-ray diffraction, the maximum peak intensity $I_1$ of the hexagonal layered compound, the maximum peak intensity $I_2$ of the spinel structure compound, and the maximum peak intensity $I_3$ of the bixbyite structure compound satisfy the following relationship:

$I_1/I_3$ is in a range of 0.05 to 20; and $I_1/I_2$ is in a range of 0.05 to 20.

5. The sputtering target according to any one of 1 to 4, which comprises an indium-tin-zinc oxide having a three-phase structure of an In-rich phase, an Sn-rich phase and a Zn-rich phase.
6. The sputtering target according to any one of 1 to 5, wherein particles of the hexagonal layered compound and the bixbyite structure compound are dispersed in the matrix of the spinel structure compound.
7. The sputtering target according to any one of 1 to 6, which has a bulk resistance in a range of 0.2 to 10 mΩ·cm.
8. The sputtering target according to any one of 1 to 7, which has a theoretical relative density of 90% or more.
9. A method for producing the sputtering target according to any one of claims 1 to 8, comprising the steps of:
preparing a mixture of a powder of an indium compound, a powder of a zinc compound, and a powder of a tin compound having a particle diameter smaller than the particle diameters of the powders of the indium compound and the zinc compound at an atomic ratio of In/(In+Sn+Zn) in a range of 0.33 to 0.6 and an atomic ratio of Sn/(In+Sn+Zn) in a range of 0.05 to 0.15;
press-molding the mixture to obtain a molded product; and
firing the molded product at 1,250 to 1,700° C. for 30 to 360 hours.
10. A transparent conductive film, which is formed by sputtering the sputtering target according to any one of 1 to 8.
11. A transparent electrode, which is formed by etching the transparent conductive film according to 10.
12. The transparent electrode according to 11, wherein the taper angle of an electrode edge is in a range of 30 to 89°.
13. A method for producing a transparent electrode comprising the step of etching the transparent conductive film according to 10 together with a metal or an alloy with a phosphoric acid-based etching solution.

The invention provides a target which has a low resistance, a high theoretical relative density, and a high strength.

The invention provides a target which is capable of conducting sputtering stably while suppressing abnormal electrical discharge generated when forming a transparent conductive film by sputtering.

The invention provides a transparent conductive film which excels in conductivity, etching properties and heat resistance.

The invention provides a transparent conductive film which can be etched with a phosphoric acid-based etching solution, which is normally used to etch a metal or an alloy. As a result, simultaneous etching with a metal or an alloy becomes possible, whereby productivity of a transparent electrode can be improved.

BEST MODE FOR CARRYING OUT THE INVENTION

Figure 1:
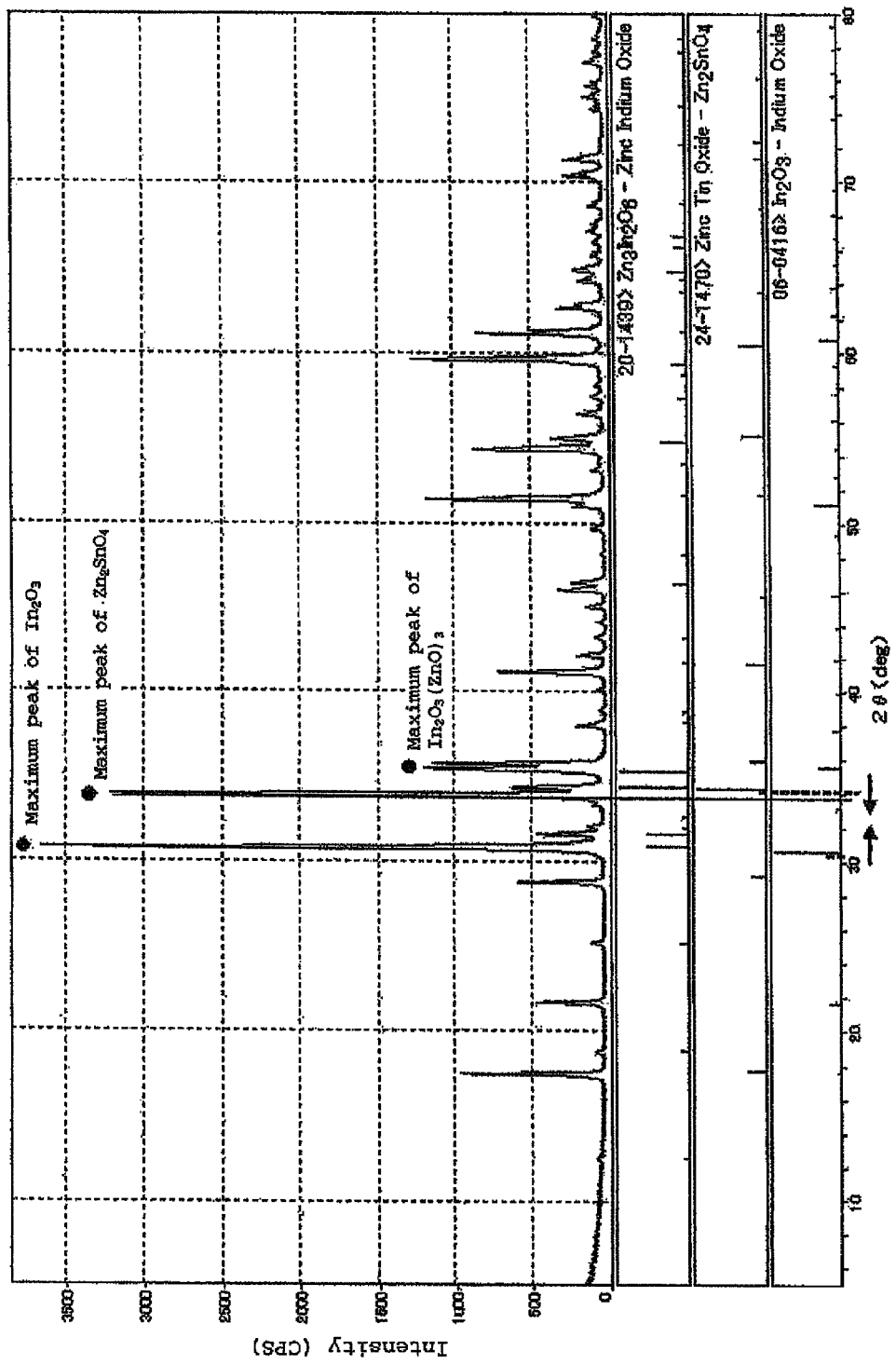
FIG. 1 is an X-ray diffraction chart of the target obtained in Example 1.

The sputtering target, the transparent conductive film and the transparent electrode of the invention will be described below in detail.

I. Sputtering Target (I-1) Constitution of Sputtering Target

The sputtering target of the invention (hereinafter often referred to as "target of the invention") comprises indium, tin, zinc and oxygen, and comprises a hexagonal layered compound, a spinel structure compound and a bixbyite structure compound.

As mentioned above, a target which contains a spinel structure compound of $Zn_2SnO_4$, a bixbyite structure compound of $In_2O_3$ and a hexagonal layered compound of $InO_2O_3(ZnO)_m$, wherein m is 3 (of hexagonal layered compounds shown by $InO_2O_3(ZnO)_m$ (wherein m is an integer of 2 to 20)), has a low resistance, a high theoretical relative density and a high strength.

The crystal conditions of the compound in the target can be judged by observing a sample extracted from the target by X-ray diffraction analysis.

The spinel structure will now be explained.

As described in "Crystal Chemistry" (M. Nakahira, Kodansha, 1973) and the like, an $AB_2X_4$ type or an $A_2BX_4$ type is called a spinel structure, and a compound having such a crystal structure is called a spinel structure compound in general.

Generally in a spinel structure, anions (usually oxygen) are filled by cubic closest packing with cations being present in part of tetrahedron or octahedron clearances.

A substituted-type solid solution in which some of the atoms and ions in the crystal structure are replaced with other atoms and an interstitial solid solution in which other atoms are added to the sites between gratings are also included in the spinel structure compounds.

The spinel structure compound of the target of the invention is preferably a compound shown by $Zn_2SnO_4$. That is, in X-ray diffraction, the compound shows a peak pattern of No. 24-1470 or an analogous (shifted) pattern of the Joint Committee on Powder Diffraction Standards (JCPDS) database.

Next, the bixbyite structure compound will be described. A bixbyite structure compound is also referred to as a rare earth oxide C-type or $Mn_2O_3$ (I)-type oxide. As described in "Technology of Transparent Conductive Film" edited by The 166th Committee of Transparent Oxide and Photoelectron Material, Japan Society for Promotion of Science, Ohmsha, Ltd. (1999)

and the like, the bixbyite structure compound has a stoichiometric ratio of $M_2X_3$, wherein M is a cation and X is an anion, usually an oxygen ion, and one unit cell is composed of 16 molecules of $M_2X_3$ and the total 80 atoms (32 Ms and 48 Xs). Among these, the bixbyite structure compound of the target of the invention is preferably a compound shown by $In_2O_3$, that is, a compound having a peak pattern of No. 06-0416 or an analogous (shifted) pattern of the Joint Committee on Powder Diffraction Standards (JCPDS) database in X-ray diffraction.

A substituted-type solid solution in which some of the atoms and ions in the crystal structure are replaced with other atoms and an interstitial solid solution in which other atoms are added to the sites between gratings are also included in the bixbyite structure compounds.

Here, the hexagonal layered compound is a compound described in L. Dupont et al., Journal of Solid State Chemistry 158, 119-133 (2001), Toshihiro Moriga et al., J. Am. Ceram. Soc., 81(5), 1310-16 (1998), and the like. The hexagonal layered compound in the invention refers to a compound shown by $In_2O_3(ZnO)_m$, wherein m is an integer of 2 to 20, or $Zn_kIn_2O_{k+3}$, wherein k is an integer.

Of the above-mentioned hexagonal layered compounds, it is preferred that a hexagonal layered compound contained in the target of the invention be $In_2O_3(ZnO)_m$, wherein m is 3. If the target contains a hexagonal layered compound wherein m is an integer other than 3, it may suffer from problems in which bulk resistance increases, target density does not increase, strength is lowered, or the like.

The target of the invention preferably has an atomic ratio of In/(In+Sn+Zn) in a range of 0.33 to 0.6 and an atomic ratio of Sn/(In+Sn+Zn) in a range of 0.05 to 0.15.

The above atomic ratios can be measured by inductively coupled plasma (ICP) spectrophotometry.

If the atomic ratio of In/(In+Sn+Zn) is less than 0.33, the target may have high resistance and the sputtering rate during sputtering may be lowered. If more than 0.6, indium reduction may be insufficient and nodules may be generated. The atomic ratio of In/(In+Sn+Zn) is more preferably in a range of 0.35 to 0.55, and particularly preferably in a range of 0.37 to 0.5.

If the atomic ratio of Sn/(In+Sn+Zn) is smaller than 0.05, formation of a spinel structure compound may be difficult. As a result, the target may have a low relative density and a high resistance. If the atomic ratio exceeds 0.15, formation of a hexagonal layered compound may be difficult and etching of a transparent conductive film prepared by sputtering with a phosphoric acid-base etching solution may be difficult. The atomic ratio of Sn/(In+Sn+Zn) is more preferably 0.06 to 0.13, particularly preferably 0.07 to 0.11.

The atomic ratio of Zn/(In+Sn+Zn) is more preferably 0.2 to 0.7, particularly preferably 0.3 to 0.6.

It is preferred that, in the target of the invention, the maximum peak intensity $I_1$ of the hexagonal layered compound, the maximum peak intensity $I_2$ of the spinel structure compound and the maximum peak intensity $I_3$ of the bixbyite structure compound in X-ray diffraction (XRD) satisfy the following relationship:

$I_1/I_3$ is in a range of 0.05 to 20

$I_1/I_2$ is in a range of 0.05 to 20

The ratio of the maximum peak intensity can be determined by calculating from the maximum peak intensity which is present in an arbitrary range (for example, the range of 2θ=15 to 65°) using a chart produced by X-ray diffraction (XDR).

If the ratio of the maximum peak intensity shown by $I_1/I_3$ is smaller than 0.05, etching of a transparent conductive film prepared by sputtering with a phosphoric acid-based etching solution may be difficult. If the ratio exceeds 20, the resistance of the target may be increased or the sputtering rate during sputtering may be lowered. It is more preferred that the ratio of the maximum peak intensity shown by $I_1/I_3$ be in a range of 0.1 to 10.

If the ratio of the maximum peak intensity shown by $I_1/I_2$ is smaller than 0.05, etching of a transparent conductive film prepared by sputtering with a phosphoric acid-based etching solution may be difficult. If the ratio exceeds 20, the resistance of the target may be increased or the sputtering rate during sputtering may be lowered. It is more preferred that the ratio of the maximum peak intensity shown by $I_1/I_2$ be in a range of 0.1 to 10.

It is preferred that the target of the invention have an indium (In)-rich phase, a tin (Sn)-rich phase and a zinc (Zn)-rich phase in the elementary analysis of its cross section using an electron probe micro analyzer (EPMA). A rich phase means an area with a higher element density (usually 1.5 to 2 times or more) than the element density of the surrounding area by EPMA analysis.

Figure 2:
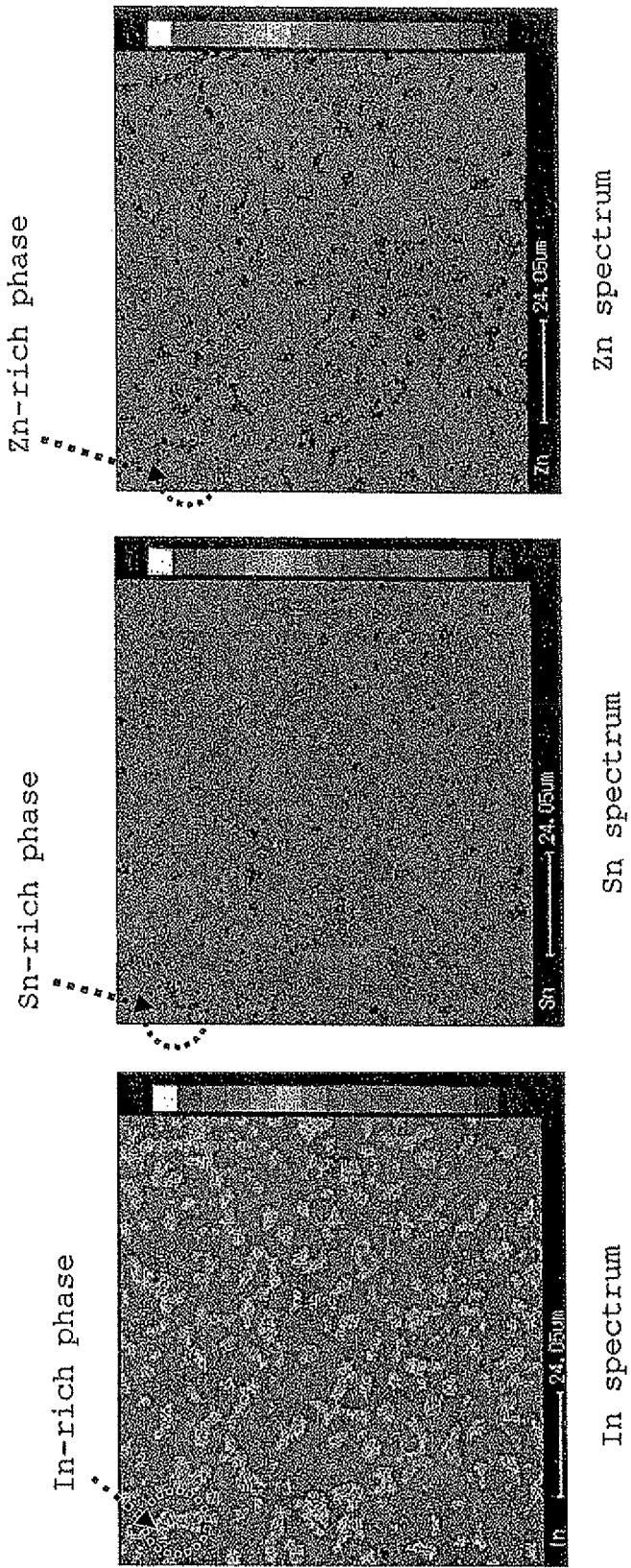
FIG. 2 is an elementary analysis image of a section of the target obtained in Example 1 taken by an electron probe micro analyzer (EPMA), showing three rich-phases (an In-rich phase, an Sn-rich phase and a Zn-rich phase).

The fact that the target of the invention has the above-mentioned three rich phases can be confirmed by using an electron probe micro analyzer (EPMA). FIG. 2 shows elementary analysis images taken by an elementary probe micro analyzer (EMPA) of the target cross section showing the typical example of each of the above-mentioned three rich phases.

If a target does not have the indium (In) rich phase tin (Sn) rich phase and zinc (Zn) rich phase, a large amount of positive divalent Zn is dissolved as a solid in a positive trivalent In compound to produce carrier traps. As a result, the carrier density may be reduced, the bulk resistance may be increased, or the density or strength of the target may be decreased due to insufficient growth of a crystal structure. The reason is thought to be as follows.

It is preferred that the target of the invention have a structure in which the particles of the hexagonal layered compound and the particles of the bixbyite structure compound are dispersed in a matrix of spinel structure compound.

Due to the particle dispersion state, the target of the invention has such advantages that the target is able to have a higher density without prefiring, and abnormal electrical discharge can be prevented since discharging state becomes stable.

The particle dispersion state as mentioned above can be confirmed by elementary analysis images taken by an elementary probe micro analyzer (EMPA) of the target cross section.

To allow the target of the invention to have the particle dispersion state as mentioned above, the crystal grain diameter of the hexagonal layered compound and that of the bixbyite structure compound are preferably 20 μm or less, more preferably 10 μm or less, and particularly preferably 5 μm or less. If the crystal grain diameter of these compounds is larger than 20 μm, abnormal electrical discharge may be likely to occur or nodules may be generated easily. Further, the particle boundary of large particles exceeding 20 μm serves as a stress concentration point, which may cause the target to be cracked easily.

The crystal grain diameter of each compound can be measured using an electron probe micro analyzer (SPMA).

To the extent that the advantages of the invention are not impaired, it is possible to add Mg, B, and Ga to improve transmittance, to add Al to improve heat resistance, and to add Zr to improve chemical resistance.

The bulk resistance of the target of the invention is preferably in a range of 0.2 to 10 mΩ·cm.

The bulk resistance of the target is measured by the four probe method.

If the bulk resistance of the target is higher than 10 mΩ·cm or the theoretical relative density is less than 90%, the target may crack during discharge. If the bulk resistance of the target is lower than 0.2 mΩ·cm, the resistance of the target may become higher than that of a film which has been peeled and adhered to the target, resulting in the generation of nodules.

The target of the invention preferably has a bulk resistance of 6 mΩ·cm or less, more preferably 4 mΩ·cm or less.

Theoretical relative density of the target of the invention is preferably 90% or more, more preferably 95% or more, and particularly preferably 98% or more. If theoretical relative density is less than 90%, the target may have reduced strength or exhibit a retarded film-forming speed, or a film produced by sputtering the target may have a high resistance.

Theoretical relative density of the target is determined as follows.

The density of the target is calculated from the content ratio of ZnO, $SnO_2$, and $In_2O_3$ assuming that their specific gravities are respectively 5.66 g/cm$^3$, 6.95 g/cm$^3$, and 7.12 g/cm$^3$. Then, the ratio of the calculated density to the density measured by Archimedes principle is calculated. The resulting value is used as theoretical relative density.

The deflecting strength of the target of the invention is preferably 10 kg/mm$^2$ or more, more preferably 11 kg/mm$^2$ or more, and particularly preferably 12 kg/mm$^2$ or more. There is a possibility that the target may be damaged due to the load applied during transportation and installation. For this reason, the target needs to have deflecting strength of a degree not less than a certain level. If the deflecting strength is less than 10 kg/mm$^2$, the target may not be usable.

The deflecting strength of the target can be measured according to JIS R1601.

In the target of the invention, it is preferable that in the X-ray diffraction (XRD), the peak position of the bixbyite structure compound shift toward the plus side (wide angle side) relative to the peak position of $In_2O_3$ powder.

The shift of the peak position of the bixbyite structure compound, at the maximum peak position (2θ), is preferably 0.05° or more, more preferably 0.1° or more, and particularly preferably 0.2° or more. From shifting toward the plus side (wide angle side), the target is assumed to have a short distance between gratings by solid-dissolution substitution of a cation having a smaller ionic radius than the indium ion. The peak position (pattern) of the X-ray diffraction (XRD) of $In_2O_3$ powder is disclosed in the Joint Committee on Powder Diffraction Standards (JCPDS) database No. 06-0416.

The peak shift angle can be measured by analyzing the X-ray diffraction chart.

If the shift of the maximum peak position of the bixbyite structure compound is less than 0.1°, carrier generation may be insufficient and the target resistance may be increased. The reason appears to be that a sufficient amount of carrier electrons is not produced due to an insufficient amount (the number of atoms) of other atoms solid-dissolved in $In_2O_3$.

In the target of the invention, the peak position of the spinel structure compound preferably shifts to the minus direction (narrow angle side). The peak shift, at the maximum peak position (2θ), is preferably 0.05° or more, more preferably 0.1° or more, and particularly preferably 0.2° or more. The distance between gratings is assumed to be long in view of the shifting to the minus direction (narrow angle side).

If the shift of the maximum peak position of the spinel structure compound is directed to the plus side (wide angle side), there is a possibility that carrier generation is insufficient and the target resistance increases. The reason appears to be that a sufficient amount of carrier electrons is not produced due to an insufficient amount (the number of atoms) of other atoms solid-dissolved in $Zn_2SnO_4$.

FIG. 1 shows an X-ray diffraction chart of a target obtained in Example 1, in which the maximum peak position of the bixbyite structure compound, relative to the maximum peak position of the X-ray diffraction (XRD) of $In_2O_3$ powder, shifts toward the plus side (wide angle side).

(I-1) Method for Producing Sputtering Target

The method for producing the sputtering target of the invention (hereinafter often referred to as "production method of the target of the invention") comprises the steps of preparing a mixture of a powder of an indium compound, a powder of a zinc compound, and a powder of a tin compound having a particle diameter smaller than the particle diameters of the powders of the indium compound and the zinc compound at an atomic ratio of In/(In+Sn+Zn) in a range of 0.33 to 0.6 and an atomic ratio of Sn/(In+Sn+Zn) in a range of 0.05 to 0.15;

press-molding the mixture to obtain a molded product; and firing the molded product at 1250 to 1700° C. for 30 to 360 hours.

Each step of the production method of the target of the invention will be described below.

(1) Mixing Step

The mixing step is an essential step of mixing the raw materials such as metal oxides of the sputtering target.

As the raw materials, a powder of an indium compound, a powder of a zinc compound, and a powder of a tin compound having a particle diameter smaller than the particle diameters of the powders of the indium compound and the zinc compound are used. If the particle diameter of the powder of the tin compound is equivalent to or larger than the particle diameters of the powders of the indium compound and the zinc compound, $SnO_2$ may remain in the target. $SnO_2$ remaining in the target may increase the bulk resistance of the target.

In addition, it is preferable that the particle diameter of the powder of the tin compound be smaller than the particle diameters of the powders of the indium compound and the zinc compound. More preferably, the particle diameter of the powder of the tin compound is one half or less of the particle diameter of the powder of the indium compound. It is particularly preferable that the particle diameter of the powder of the zinc compound be smaller than that of the powder of the indium compound.

The particle diameters of the metal compounds used as the raw material of the target can be measured according to JIS R1619.

The compounds of indium, tin and zinc, which are the raw materials of the target, are required to be mixed such that the atomic ratio of In/(In+Sn+Zn) be in a range of 0.33 to 0.6 and the atomic ratio of Sn/(In+Sn+Zn) be in a range of 0.05 to 0.15. If the atomic ratios are outside the above-mentioned ranges, the target of the invention having the above-mentioned advantageous effects cannot be obtained.

As examples of the compound of indium, indium oxide, indium hydroxide or the like can be given.

As examples of the compound of tin, tin oxide, tin hydroxide or the like can be given.

As examples of the compound of zinc, zinc oxide, zinc hydroxide or the like can be given.

In view of readiness in sintering and suppression of generation of bi-products, oxides are preferable as the compound.

It is preferable to homogeneously blend and pulverize the metal oxides used as the raw material for producing the target using a common mixer such as a wet ball mill or a bead mill or using an ultrasonic device.

When pulverizing the metals oxides of the raw materials of the target, the particle diameter of the metal oxides after pulverization is usually 10 μm or less, preferably 3 μm or less, more preferably 1 μm or less. When the particle diameter of the metal oxides is too large, it may be difficult to increase the density of the target.

The particle diameters of the metal compounds used as the raw material of the target after pulverization can be measured according to JIS R1619.

(2) Prefiring Step

A prefiring step is optionally provided in order to preliminarily fire the mixture of indium compounds, zinc compounds, and tin compounds after preparation of such a mixture.

In the prefiring step, it is preferable to treat the metal oxide mixture with heat at 500 to 1,200° C. for 1 to 100 hours. If the temperature is lower than 500° C. or the period of heat treatment is less than one hour, thermal decomposition of the indium compound, zinc compound, and tin compound may be insufficient. If the temperature is higher than 1,200° C. or the period of heat treatment is more than 100 hours, the resulting particles may become coarse.

Therefore, it is particularly preferable to heat-treat (prefire) the mixture at a temperature in a range of 800 to 1,200° C. for 2 to 50 hours.

The prefired body obtained in this step is preferably pulverized before the following molding step and firing step. The pulverization of the prefired body is preferably carried out by using a ball mill, a roll mill, a pearl mill, a jet mill, or the like so that the prefired body has a particle diameter in a range of 0.01 to 1.0 μm. If the particle diameter of the prefired body is less than 0.01 μm, the bulk density may become too small to handle the resulting powder with ease. If larger than 1.0 μm, it may be difficult to increase the density of the target.

The particle diameter of the prefired body can be measured according to JIS R1619.

(3) Molding Step

The molding step is an essential step of press-molding the mixture of metal oxides (or the prefired body when the prefiring step is provided) to form the molded product. The product is molded into a form suitable as a target. When the prefiring step is provided, the resulting prefired fine powder can be granulated and the granules may be formed into a desired shape by press-molding.

Although die molding, cast molding, injection molding, and the like can be given as the method for molding that can be used in this step, a cold isostatic press (CIP) method or the like is preferable in order to obtain a sintered body (target) with a high sintered density.

A mold assistant agent such as polyvinyl alcohol, methyl cellulose, poly wax, and oleic acid may be used in the molding process.

(4) Firing Step

The firing step is an essential step of firing the molded product obtained by granulating fine powder and press-molding the granules to a desired shape in the molding step.

The firing can be carried out by hot isostatic press (HIP) firing and the like.

The firing is carried out in an oxygen atmosphere or under an oxygen pressure at a temperature usually of 125 to 1,700° C., preferably 1,300 to 1,650° C., and more preferably 1,350 to 1,600° C. for usually 30 minutes to 360 hours, preferably 8 to 180 hours, and more preferably 12 to 120 hours. If the firing temperature is less than 1,250° C., it may be difficult to increase the density of the target, it may take too long for sintering, or raw materials may remain unreacted. If higher than 1,700° C., the composition may change due to vaporization of the components or there is a possibility of damaging the kiln.

On the other hand, if the powder mixture is fired in an atmosphere not containing oxygen gas or at a temperature higher than 1,700° C., generation of a hexagonal layered compound may be predominant and formation of spinel crystals may be insufficient. Further, Sn and Sn compounds may gasify to damage the kiln. If the firing temperature is lower than 1,250° C., the objective crystal forms may not be produced, the sintering density of the target may not increase, the target resistance may increase, and strength may decrease. A low firing temperature may result in generation of a high-resistance hexagonal layered compound shown by $In_2O_3(ZnO)_m$, wherein m is an integer of 4 to 20.

The heating rate is preferably 5 to 600° C./hour, more preferably 50 to 500° C./hour, particularly preferably 100 to 400° C./hour or less. If the heating rate is more than 600° C./hour, a hexagonal layered compound may be produced predominantly, leading to insufficient formation of spinel crystals. If the heating rate is lower than 5° C./hour, firing may take time, resulting in lowered productivity.

The cooling rate is preferably 5 to 600° C./hour, more preferably 50 to 500° C./hour, particularly preferably 100 to 400° C./hour or less. If the cooling rate is more than 600° C./hour, a hexagonal layered compound may be produced predominantly, leading to insufficient formation of spinel crystals. If the cooling rate is lower than 5° C./hour, firing may take time, resulting in lowered productivity.

(5) Reducing Step

A reducing step is optionally provided in order to uniform the bulk resistance of the sintered body obtained in the firing step throughout the entire target by a reducing treatment.

As examples of the reducing method used in this step, a method of using a reducing gas, a method of reducing by firing under vacuum, a method of reducing in an inert gas, and the like can be given.

In the case of the reducing treatment using a reducing gas, hydrogen, methane, carbon monoxide or a mixture of these gases with oxygen may be used.

In the case of reduction by sintering in an inert gas, nitrogen, argon, or a mixture of these gases with oxygen may be used.

The reducing treatment is carried out usually at 100 to 800° C., and preferably 200 to 800° C., for usually 0.01 to 10 hours, and preferably 0.05 to 5 hours.

(6) Working Step

A working step is optionally provided to cut the sintered body obtained by sintering in the above-mentioned manner into a form suitable for mounting on a sputtering apparatus and to attach a mounting jig such as a backing plate.

The thickness of the target is usually 2 to 20 mm, preferably 3 to 12 mm, and particularly preferably 4 to 6 mm. It is possible to attach two or more targets to one backing plate to obtain a single target in substance. The surface is preferably finished using a No. 80 to 10,000 diamond wheel, and particularly preferably using a No. 100 to 1,000 diamond wheel. If a diamond wheel with a number smaller than No. 80 is used, the target may be easily cracked. To increase the strength of the target, it is preferred that grinding be performed in the longitudinal direction of the target.

Although the use of the above-mentioned production method of the target of the invention is preferable in order to produce the target of the invention, the method is not particularly limited insofar as the raw materials of the target with the above-mentioned particle size are mixed at the above-mentioned specific atomic ratio and processed under the above-mentioned sintering temperature and sintering time specified for the firing step. The other steps can be carried out without particular limitations. For example, common methods disclosed in JP-A-2002-69544, JP-A-2004-359984, and Japanese Patent No. 3628554, as well as the following methods can be used. A production method involving parts of these methods in combination may also be used.

Method of Manufacturing Sputtering Target for Industrial Use (1)
(i) Wet-blend and pulverize weighed raw materials together with water and adjuvants in a ball-mill, bead mill, etc.
(ii) Dry the resulting raw material mixture using a spray dryer, etc., and granulate to obtain a granule powder.
(iii) Press-mold the granule powder, followed by SIP molding using a rubber die.
(iv) Fire the molded product under oxygen pressure to obtain a fired body.
(v) Cut the resulting fired body using a diamond cutter, water cutter, etc. and grind using a diamond wheel, etc.
(vi) Apply a wax agent such as metal indium, and secure the resulting target to a backing plate made of copper or the like.
(vii) Grind the backing plate to remove the wax agent, oxidized layer, etc. and treat the surface of the target.

Method of Manufacturing Sputtering Target for Industrial Use (2)
(i) Dry-blend and pulverize weighed raw materials in a ball mill or the like to obtain a granule powder.
(ii) Press-mold the resulting granular powder.
(iii) Fire the molded product under atmospheric pressure to obtain a fired body.

Method of Manufacturing Sputtering Target for Industrial Use (3)
(i) Dry-blend and pulverize weighed raw materials in a ball mill or the like to obtain a granule powder.
(ii) Wet-blend and pulverize the granule powder in a ball mill, V-blender, etc. to obtain a dispersion of granule powder.
(iii) Mold the dispersion of granule powder using a mold die to obtain a molded product.
(iv) Dry the molded product by bringing into contact with air on a supporting body, and fire under atmospheric pressure to obtain a fired product.

The transparent conductive film of the invention has a specific resistance of preferably 1,800 μΩ·cm or less, more preferably 1,300 μΩ·cm or less, and particularly preferably 900 μΩ·cm or less.

The specific resistance of the transparent conductive film can be measured by the four probe method.

The thickness of the transparent conductive film of the invention is usually 1 to 500 nm, preferably 10 to 240 nm, more preferably 20 to 190 nm, and particularly preferably 30 to 140 nm. If the thickness is larger than 500 nm, there is a possibility that the film partly crystallizes or it takes a long time to form the film; if smaller than 1 nm, the film may be affected by the substrate and may have a high specific resistance. The thickness of the transparent conductive film can be measured by the stylus method.

II. Transparent Conductive Film
(II-1) Constitution of Transparent Conductive Film The transparent conductive film of the invention is formed by the sputtering method using the target of the invention.

The transparent conductive film of the invention is preferably amorphous or microcrystalline, with the amorphous transparent conductive film being particularly preferable. If the transparent conductive film is crystalline, the etching rate during preparation of a transparent electrode (explained later) may be slow, residues may remain after etching, and the taper angle of an electrode edge may not be in a range of 30° to 89° when a transparent electrode is produced.

(II-2) Method for Producing Transparent Conductive Film

Although there are no particular limitations to the sputtering method and the sputtering conditions for producing the transparent conductive film of the invention, the direct current (DC) magnetron method, the alternate current (AC) magnetron method, and the high frequency (RF) magnetron method are preferable. Since a large apparatus is required for application to a liquid crystal display (LCD) panel, the DC magnetron method and the AC magnetron method are preferable, with the AC magnetron method which enables stable film forming being particularly preferred.

Sputtering can be carried out under a pressure usually in a range of 0.05 to 2 Pa, preferably 0.1 to 1 Pa, and more preferably 0.2 to 0.8 Pa, under an ultimate pressure usually in a range of $10^{-3}$ to $10^{-7}$ Pa, preferably $5 \times 10^{-4}$ to $10^{-6}$ Pa, and more preferably $10^{-4}$ to $10^{-5}$ Pa, and at a substrate temperature usually in a range of 25 to 500° C., preferably 50 to 300° C., and more preferably 100 to 250° C.

An inert gas such as Ne, Ar, Kr, Xe and the like can be usually used as an introduced gas. Of these, Ar is preferable from the viewpoint of a high film-forming speed. In the case in which the ratio of zinc to tin is less than 1 (Zn/Sn<1), inclusion of oxygen in the introduced gas in an amount of 0.01 to 5% is preferable because of easy reduction of the bulk resistance. When the ratio of zinc to tin is more than 2 (Zn/Sn>2), inclusion of hydrogen in the introduced gas in an amount of 0.01 to 5% is preferable because of easy reduction of the resistance of the transparent conductive film.

Although the amount of indium is reduced, the transparent conductive film of the invention excels in conductivity, etching properties, heat resistance and other properties. In addition, the transparent conductive film of the invention can be etched with a phosphoric acid-based etching solution, which is commonly used for etching a metal or an alloy. Therefore, the transparent conductive film of the invention has such an advantage that it can be etched together with a metal or an alloy.

The transparent conductive film of the invention has a specific resistance of preferably 3,000 μΩ·cm or less, more preferably 1,500 μΩ·cm or less, and particularly preferably 1,000 μΩ·cm or less.

The specific resistance of the transparent conductive film can be measured by the four probe method.

III. Transparent Electrode
(III-1) Constitution of Transparent Electrode

The transparent electrode of the invention is prepared by etching the transparent conductive film of the invention. Therefore, the transparent electrode has the above-mentioned properties of the above-mentioned transparent conductive film of the invention.

The electrode edge of the transparent electrode of the invention has a taper angle of preferably 30 to 89°, more preferably 35 to 85°, and particularly preferably 40 to 80°.

The taper angle at the electrode edge can be measured by observing the cross-section using a scanning electron microscope (SEM).

If the electrode edge has a taper angle of less than 30°, the length of the electrode edge portion becomes too long. When a liquid crystal panel or an organic electroluminescence panel is driven, there may be a difference of contrast between the pixel peripheral part and the inside. If the taper angle is more than 89°, the electrode may crack or delaminate at the edge portion, which may cause defects of an oriented film and breakage.

(III-2) Method for Producing Transparent Electrode

The method for producing a transparent electrode according to the invention comprises the step of etching the above-mentioned transparent conductive film of the invention together with a film formed of a metal or an alloy using a phosphoric acid-based etching solution.

In the method for producing the transparent conductive electrode of the invention, it is preferable to produce a transparent electrode where the taper angle at an electrode edge is in a range of 30 to 89°.

There are no particular restrictions on the etching method used in the production of the transparent electrode of the invention, and etching can be performed with any of known etching solutions and by any of known etching methods. It is preferred, however, that the transparent conductive film be etched with a phosphoric acid-based etching solution.

By using a phosphoric acid-based etching solution, the transparent conductive film can be etched together with a film of a metal or an alloy which is formed on the substrate side of the transparent conductive film.

The phosphoric acid-based etching solution is defined as an aqueous solution which contains 20 to 100 mass % of phosphoric acid. A mixture of phosphoric acid, nitric acid and acetic acid (generally called PAN) is preferable. PAN containing 20 to 95 mass % of phosphoric acid, 0.5 to 5 mass % of nitric acid and 3 to 50 mass % of acetic acid is more preferable.

Representative PAN contains 1 to 5 mass % of nitric acid, 80 to 95 mass % of phosphoric acid and 4 to 15 mass % of acetic acid, and commonly used for etching Al or the like.

For etching Ag or the like, PAN containing 1 to 5 mass % of nitric acid, 30 to 50 mass % of phosphoric acid and 30 to 50 mass % of acetic acid may be used.

The concentration of the phosphoric acid in the phosphoric acid-based etching solution is preferably in a range of 20 to 95 wt %, more preferably 30 to 95 wt %, and particularly preferably 50 to 95 wt %. If the phosphoric acid concentration is low, the taper angle at an electrode edge portion may be smaller than 30° or etching time may be prolonged, causing productivity to be lowered.

The temperature of an etching solution is normally in a range of 15 to 55° C., preferably in a range of 20 to 50° C., and more preferably 25 to 45° C. If the temperature of an etching solution is too high, the line width or the like may not be controlled since etching is performed too fast. In contrast, if the temperature of an etching solution is too low, etching may take time to lower productivity.

The etching rate when a formed transparent conductive film is etched by using a phosphoric acid-based solution at 50° C. is usually 30 to 1,000 nm/min, preferably 40 to 300 nm/min, and particularly preferably 50 to 200 nm/min. If less than 30 nm/min, not only the tact time is retarded, but etching residues may remain on the resulting transparent electrode. An etching rate of more than 1,000 nm/min may be too fast to control the line width and the like.

Examples of a metal or an alloy which can be etched together with the transparent conductive film of the invention include a metal such as Al, Ag, Mo and Cr and an alloy thereof. Of these, Al or Ag, and an alloy thereof are preferable. Al and its alloy are particularly preferable.

Since the transparent conductive film of the invention can be etched together with these metals or alloys, etching steps can be reduced to improve productivity.

EXAMPLES

The invention will be described in more detail with reference to the following examples which should not be construed as limiting the scope of the invention.

Example 1

(1) Production of Sputtering Target

As raw materials for the target, indium oxide with an average particle diameter of 1 μm or less and a purity of 4N, zinc oxide with an average particle diameter of 1 μm or less and a purity of 4N, and tin oxide with an average particle diameter of 1 μm or less and a purity of 4N were mixed at atomic ratios of In/(In+Sn+Zn)=0.44, Sn/(In+Sn+Zn)=0.12, and Zn/(In+Sn+Zn)=0.44. The mixture was supplied to a wet-type ball mill and pulverized for 20 hours to obtain a raw material fine powder.

The resulting mixture slurry was removed, filtered, dried and granulated. The granulated product was then molded by the cold isostatic pressing at a pressure of 294 MPa. The molded product was placed in a firing kiln, and fired at 1400° C. for 48 hours under an oxygen gas pressure, whereby a sintered body (target) was obtained. The heating rate was 50° C./hour until it reached 1,000° C. Between 1,000° C. and 1,400° C., the heating rate was 150° C./hour. The cooling rate was 100° C./hour.

(2) Evaluation of Physical Properties of Sputtering Target

The theoretical relative density, bulk resistance, X-ray diffraction analysis, crystal grain diameter, and deflecting strength of the target obtained in (1) above were measured.

The theoretical relative density of the resulting target was 98%, and the bulk resistance measured by the four probe method was 3.5 mΩ·cm.

The crystal state in the transparent conductive film material was observed by the X-ray diffraction method using a sample collected from the sintered body. As a result, the hexagonal layered compound of $In_2O_3(ZnO)_3$, the spinel structure compound of $Zn_2SnO_4$ and the bixbyite structure compound of $In_2O_3$ were observed.

As shown in FIG. 1, the maximum peak of the spinel structure compound shifted by 0.4° to the narrow angle side, and the maximum peak of the bixbyite structure compound shifted by 0.2° to the wide angle side.

In addition, the resulting sintered body was buried in a resin. After grinding with alumina particles with a particle diameter of 0.05 μm, the surface was inspected by an electron probe micro analyzer (EPMA) ("EPMA-2300" manufactured by Shimadzu Corp.) under the following conditions.

Accelerating voltage: 15 kV
Sample current: 0.05 μA
Beam Size: 1 μm
Step Size: 0.2×0.2 μm As a result of measurement under the above conditions, the sintered body was confirmed to have the indium (In) rich phase, the tin (Sn) rich phase and the zinc (Zn) rich phase as shown in FIG. 2. The indium (In) rich phase is assumed to be a bixbyite structure compound of $In_2O_3$ and had an average particle diameter of 20 μm or less and the zinc (Zn) phase is assumed to be a hexagonal layered compound of $In_2O_3(ZnO)_3$ and had an average particle diameter of 20 μm or less.

The sintered body obtained in (1) above was cut and processed with a No. 400 diamond wheel to prepare a sputtering target with a diameter of about 10 cm and a thickness of about 5 mm.

The physical properties of the sputtering target were measured. The surface roughness Ra of the ground surface was 0.3 μm.

(3) Preparation of Transparent Conductive Oxide Transparent Conductive Film

The sputtering target obtained in (1) above was mounted on a DC magnetron sputtering apparatus to prepare a transparent conductive film on a glass plate at room temperature.

The sputtering was carried out under the conditions of a sputtering pressure of $1\times10^{-4}$ Pa, an ultimate pressure of $5\times10^{-4}$ Pa, a substrate temperature of 200° C., electrical power of 120 W, and a film forming time of 15 minutes.

As a result, a transparent conductive glass consisting of a transparent conductive film with a thickness of about 100 nm formed on the glass substrate was obtained.

(4) Evaluation of Sputtering State (i) Occurrence of Abnormal Electrical Discharge The sputtering target obtained in (1) above was mounted on a DC magnetron sputtering apparatus and sputtered under the same conditions as in (3) above, except that a mixed gas of argon gas and 3% hydrogen gas was used. Occurrence of abnormal electrical discharge was monitored during the sputtering to confirm that no abnormal electrical discharge occurred during continuous sputtering for 240 hours. In the following Table 1, the occurrence of abnormal electrical discharge is indicated by "Yes" and nonoccurrence is indicated by "No".

(ii) Number of Nodules Produced

Sputtering was carried out continuously for eight hours using the sputtering target obtained in (1) under the same conditions as in (3) above. The surface of the target after sputtering was observed with a stereomicroscope at a magnification of 30 times. The number of nodules with a size of 20 μm or more produced in a 900 mm² visual field, encircled by three arbitrary points on the target, was counted and the average was calculated.

(5) Evaluation of Properties of Transparent Conductive Film

To evaluate the electric conductivity of the transparent conductive film on the transparent conductive glass obtained in (3) above, the specific resistance was measured by the four probe method to show that the specific resistance was 700 μΩ·cm.

The transparent conductive film was confirmed to be amorphous by X-ray diffraction analysis.

To evaluate smoothness of the film surface, the P-V value (according to JIS B0601) was measured to indicate that the P-V value was 5 nm, indicating good smoothness.

To evaluate transparency of the transparent conductive film, transmission of a light with a wavelength of 500 nm was measured with a spectrophotometer to confirm that the light transmission was 88%, indicating excellent transparency of the film.

This transparent conductive film was etched at 50° C. with a representative phosphoric acid-based etching solution (a solution containing 3.3 mass % of nitric acid, 91.4 mass % of phosphoric acid and 10.4 mass % of acetic acid, which will hereinafter be referred to as PAN). The etching rate was 40 nm/min.

After etching, the film was examined by means of a scanning electron microscope (SEM), and only a small amount of etching residues were observed. From the results, it was confirmed that the transparent conductive film had excellent etching properties. In the following table 1, "good" indicates that the amount of etching residues after the etching with PAN is small, and "poor" indicates that the large amount of etching residues after the etching with PAN is large or that a transparent conductive film could not be etched with PAN, thereby leaving a large amount of etching residues.

The measuring conditions of the X-ray-diffraction measurement (XRD) of the transparent conductive film were as follows.

Device: "Ultima-III" manufactured by Rigaku Corp.

X rays: Cu-Kα ray (wavelength; 1.5406 Å, monochromized by a graphite monochromator)

2θ-θ reflection method, continuous scan (1.0°/min)

Sampling interval: 0.02°

Slit DS, SS: 2/3°, RS: 0.6 mm

Examples 2 and 3 and Comparative Examples 1 to 5

Targets and transparent conductive films were produced and evaluated in the same manner as in Example 1, except that the compositions of the raw materials were changed such that the atomic ratios shown in Table 1 could be obtained, and that, in Comparative Examples 1, 2 and 3, RF sputtering was used.

TABLE 1

| | | | Example | | | Comparative Example | | | | |
|---|---|---|---|---|---|---|---|---|---|---|
| | | | 1 | 2 | 3 | 1 | 2 | 3 | 4 | 5 |
| | Target (sintered body) | | | | | | | | | |
| Atomic ratio | In/(In + Sn + Zn) | | 0.44 | 0.37 | 0.50 | 0.16 | 0.00 | 0.00 | 0.42 | 0.90 |
| | Sn/(In + Sn + Zn) | | 0.12 | 0.14 | 0.10 | 0.42 | 0.12 | 0.33 | 0.58 | 0.10 |
| | Zn/(In + Sn + Zn) | | 0.44 | 0.49 | 0.40 | 0.42 | 0.88 | 0.67 | 0.00 | 0.00 |
| Sintering conditions | Sintering temperature | | 1,400 | 1,400 | 1,400 | 1,400 | 1,400 | 1,400 | 1,400 | 1,400 |
| | Sintering period | | 48 | 48 | 48 | 48 | 48 | 48 | 48 | 48 |
| X-ray diffraction | Crystal form | $In_2O_3$ | Yes | Yes | Yes | Yes | | | Yes | Yes |
| | | $Zn_2SnO_4$ | Yes | Yes | Yes | | Yes | Yes | | |
| | | $SnO_2$ | | | | Yes | | | Yes | |
| | | ZnO | | | | | Yes | | | |
| | | $In_2O_3(ZnO)_3$ | Yes | Yes | Yes | | | | | |

TABLE 1-continued

| | | Example | | | Comparative Example | | | | |
|---|---|---|---|---|---|---|---|---|---|
| | | 1 | 2 | 3 | 1 | 2 | 3 | 4 | 5 |
| | $In_2O_3(ZnO)_7$ | | | | Yes | | | | |
| | $Sn_3In_4O_{12}$ | | | | | | | | Yes |
| | Maximum peak ratio $[I(In_2O_3(ZnO)_3)/I(In_2O_3)]$ | 0.8 | 0.3 | 1.2 | 0 | — | — | 0 | 0 |
| | Maximum peak ratio $[I(In_2O_3(ZnO)_3)/I(Zn_2SnO_4)]$ | 0.6 | 0.1 | 0.8 | — | 0 | 0 | — | — |
| Target properties | Theoretical relative density (%) | 98 | 99 | 98 | 79 | 72 | 78 | 60 | 88 |
| | Bulk resistance (mΩ·cm) | 3.5 | 5.5 | 2.5 | 17,000 | 370 | 3500 | 150 | 15 |
| | Deflecting strength (kg/mm$^2$) | 13 | 13 | 13 | 9 | 8 | 9 | 7 | 11 |
| | Transparent conductive film | | | | | | | | |
| Sputtering conditions | Abnormal electrical discharge | Good | Good | Good | Poor | Poor | Poor | Poor | Poor |
| | Nodule (number of nodules/8 hrs/90 mm$^2$) | 0 | 0 | 0 | 0 | 0 | 0 | 48 | 33 |
| Properties of film | Specific resistance (μΩ·cm) | 700 | 950 | 700 | 4,000 | 300,000 | 40,000 | 20,000 | 10,000 |
| | Crystallinity (X-ray diffraction) | Amorphous | Amorphous | Amorphous | Amorphous | Amorphous | Amorphous | Amorphous | Crystalline |
| | PAN etching rate (nm/min, 50° C.) | 40 | 30 | 80 | <20 | 20 | <20 | <20 | <20 |
| | Etching residue | None | None | None | Present | Present | Present | Present | Present |

INDUSTRIAL APPLICABILITY

The transparent conductive film formed by sputtering using the target of the invention excels in conductivity, etching properties, heat resistance or other properties, even though the amount of indium is reduced, and is suited for use in various applications including displays represented by liquid crystal displays, touch panels and solar cells.

The transparent conductive film formed by sputtering using the target of the invention can contribute to improvement in productivity of a transparent electrode since it can be etched with a phosphoric acid-based etching solution which is commonly used for etching a metal or an alloy.

Since the target of the invention allows sputtering to be performed stably, it can be applied to film formation of a transparent oxide semiconductor represented by a TFT (thin film transistor) by adjusting conditions of film formation, for example.

The invention claimed is:

1. A transparent conductive film, which is formed by sputtering a sputtering target comprising indium, tin, zinc and oxygen, and comprising a hexagonal layered compound represented by the formula of $In_2O_3(ZnO)_m$, wherein m is 3, a spinel structure compound and a bixbyite structure compound, wherein in the sputtering target, the atomic ratio of In/(In+Sn+Zn) is in a range of 0.33 to 0.6 and the atomic ratio of Sn/(In+Sn+Zn) is in a range of 0.05 to 0.15, and wherein in X-ray diffraction, the maximum peak intensity $I_1$ of the hexagonal layered compound, the maximum peak intensity $I_2$ of the spinel structure compound, and the maximum peak intensity $I_3$ of the bixbyite structure compound satisfy the following relationship:

$I_1/I_3$ is in a range of 0.05 to 20; and $I_1/I_2$ is in a canoe of 0.05 to 20".

2. A transparent electrode, which is formed by etching the transparent conductive film according to claim 1.

3. The transparent electrode according to claim 2, wherein the taper angle of an electrode edge is in a range of 30 to 89°.

4. The transparent conductive film according to claim 1, wherein, in the sputtering target, the hexagonal layered compound is shown by $In_2O_3(ZnO)_3$, the spinel structure compound is shown by $Zn_2SnO_4$, and the bixbyite structure compound shown by $In_2O_3$.

5. The transparent conductive film according to claim 1, wherein the sputtering target comprises an indium-tin-zinc oxide having a three-phase structure of an In-rich phase, an Sn-rich phase and a Zn-rich phase.

6. The transparent conductive film according to claim 1, wherein, in the sputtering target, particles of the hexagonal layered compound and the bixbyite structure compound are dispersed in the matrix of the spinel structure compound.

7. The transparent conductive film according to claim 1, wherein the sputtering target has a bulk resistance in a range of 0.2 to 10 mΩ·cm.

8. The transparent conductive film according to claim 1, wherein the sputtering target has a theoretical relative density of 90% or more.

9. A transparent electrode, which is formed by etching the transparent conductive film according to claim 1.

10. A method for producing a transparent electrode comprising the step of etching the transparent conductive film according to claim 1 together with a metal or an alloy with a phosphoric acid-based etching solution.

11. A method for producing the sputtering target comprising indium, tin, zinc and oxygen, and comprising a hexagonal layered compound, a spinel structure compound and a bixbyite structure compound, said method comprising the steps of:

preparing a mixture of a powder of an indium compound, a powder of a zinc compound, and a powder of a tin compound having a particle diameter smaller than the particle diameters of the powders of the indium compound and the zinc compound at an atomic ratio of In/(In+Sn+Zn) in a range of 0.33 to 0.6 and an atomic ratio of Sn/(In+Sn+Zn) in a range of 0.05 to 0.15;

press-molding the mixture to obtain a molded product; and firing the molded product at 1,250 to 1,700° C. for 30 to 360 hours, wherein said hexagonal layered compound is represented by the formula $In_2O_3(ZnO)_3$ and wherein in X-ray diffraction, the maximum peak intensity $I_1$ of the hexagonal layered compound, the maximum peak intensity $I_2$ of the spinel structure compound, and the maximum peak intensity $I_3$ of the bixbyite structure compound satisfy the following relationship: $I_1/I_3$ is in a range of 0.05 to 20; and $I_1/I_2$ is in a range of 0.05 to 20.

12. The method according to claim 11, wherein in the sputtering target, particles of the hexagonal layered compound and the bixbyite structure compound are dispersed in the matrix of the spinel structure compound.

13. The method according to claim 11, wherein the sputtering target, has a bulk resistance in a range of 0.2 to 10 mΩ·cm.

14. The method according to claim 11, wherein the sputtering target, has a theoretical relative density of 90% or more.

* * * * *